United States Patent
Ma et al.

(10) Patent No.: US 11,442,132 B2
(45) Date of Patent: Sep. 13, 2022

(54) SYSTEMS FOR AND METHODS OF POSITIONING SOLAR PANELS IN AN ARRAY OF SOLAR PANELS TO EFFICIENTLY CAPTURE SUNLIGHT

(71) Applicant: NEXTracker Inc., Fremont, CA (US)

(72) Inventors: Yudong Ma, Richmond, CA (US); Francesco Borrelli, Kensington, CA (US); Allan Daly, Albany, CA (US); Yang Liu, Mountain View, CA (US)

(73) Assignee: NEXTRACKER LLC, Fremont, CA (US)

( * ) Notice: Subject to any disclaimer, the term of this patent is extended or adjusted under 35 U.S.C. 154(b) by 272 days.

(21) Appl. No.: 16/629,300

(22) PCT Filed: Jul. 6, 2018

(86) PCT No.: PCT/US2018/041045
§ 371 (c)(1),
(2) Date: Jan. 7, 2020

(87) PCT Pub. No.: WO2019/010387
PCT Pub. Date: Jan. 10, 2019

(65) Prior Publication Data
US 2021/0141047 A1 May 13, 2021

Related U.S. Application Data

(60) Provisional application No. 62/529,679, filed on Jul. 7, 2017.

(51) Int. Cl.
*G01S 3/786* (2006.01)
*H02S 20/32* (2014.01)
(Continued)

(52) U.S. Cl.
CPC .......... *G01S 3/7861* (2013.01); *G05D 3/105* (2013.01); *H02S 20/32* (2014.12); *H02S 40/20* (2014.12)

(58) Field of Classification Search
CPC ....... G01S 3/7861; G05D 3/105; H02S 20/32; F24S 50/20; F24S 2020/16
See application file for complete search history.

(56) References Cited

U.S. PATENT DOCUMENTS 8,466,399 B1 *  6/2013  Sherman ................. H02S 20/00
                                                    250/203.4
9,677,809 B1 *  6/2017  Eustis ........................ F25B 7/00
(Continued)

FOREIGN PATENT DOCUMENTS

CN   102326034 A    1/2012
CN   103472858 A   12/2013
(Continued)

OTHER PUBLICATIONS

Chinese Office Action with Search Report issued in Chinese Application No. 201880053640.5 dated Apr. 2, 2021, with English translation, 29 pages.
(Continued)

*Primary Examiner* — Thanh Luu
(74) *Attorney, Agent, or Firm* — Weber Rosselli & Cannon LLP

(57) ABSTRACT

A solar tracking system (200) comprises multiple solar panel modules (SPMi) forming a grid of solar panel modules, wherein the multiple solar panel modules (SPMi) are orientatable to a solar source independently of each other; and a control system (SPCi) configured to orient each of the multiple solar panel modules (SPMi) to the solar source independently of each other based on a performance model to optimize an energy output from the grid of solar panel modules, wherein the performance model predicts an energy (Continued)

output from the grid of solar panel modules based on a topography of the area containing the grid of solar panel modules and weather conditions local to each of the solar panel modules (SPMi).

19 Claims, 22 Drawing Sheets

(51) Int. Cl.
 *G05D 3/10* (2006.01)
 *H02S 40/20* (2014.01)

(56) References Cited

U.S. PATENT DOCUMENTS

| | | | |
|---|---|---|---|
| 2010/0198420 A1* | 8/2010 | Rettger | H02S 10/00 700/291 |
| 2011/0178641 A1 | 7/2011 | Judkins | |
| 2011/0308512 A1 | 12/2011 | Nakasato et al. | |
| 2012/0004780 A1 | 1/2012 | Miller et al. | |
| 2012/0065788 A1 | 3/2012 | Harper, III et al. | |
| 2013/0269754 A1 | 10/2013 | Judkins | |
| 2015/0177415 A1 | 6/2015 | Bing | |
| 2015/0331972 A1* | 11/2015 | McClure | G06F 17/11 703/2 |
| 2015/0377518 A1* | 12/2015 | Maxey | F24S 30/425 126/714 |
| 2016/0179994 A1 | 6/2016 | Levine et al. | |
| 2017/0070187 A1 | 3/2017 | Jain et al. | |
| 2017/0356609 A1* | 12/2017 | Gelbaum | G02B 19/0042 |

FOREIGN PATENT DOCUMENTS

| | | |
|---|---|---|
| CN | 106026882 A | 10/2016 |
| CN | 103003818 B | 12/2016 |
| CN | 106502274 A | 3/2017 |
| FR | 3038397 A1 | 1/2017 |
| WO | 2017001791 A1 | 1/2017 |

OTHER PUBLICATIONS

Notice of Acceptance issued in Australian Patent Application No. 2018297172 dated Jun. 22, 2021, 4 pages.
PCT Search Report and Written Opinion issued in PCT Application No. PCT/US2018/041045 dated Oct. 17, 2018, 16 pages.
Examination Report No. 1 issued in Australian Patent Application No. 2018297172 dated Nov. 17, 2020, 5 pages.
Jeffrey R. S. Brownson, "New Energy Technology Translations Solar Energy Conversion System," (US), pp. 183-186, Beijing, China Three Gorges Press, Dec. 2016. English translation not available but the English-language version of the Second Office Action Issued by China National Intellectual Property Administration, which is cited herein, explains and/or quotes the relevant portions of this NPL at pp. 2, 7, 9, and 12-14.
Partial European Search Report issued in European Application No. 21201943.4 dated Jan. 19, 2022, 15 pages.
Second Chinese Office Action issued in Chinese Patent Application No. 201880053640.5 dated Dec. 30, 2021 with English translation, 31 pages.
Extended European Search Report issued in European Patent Application No. 21201943.4 dated May 6, 2022.

* cited by examiner

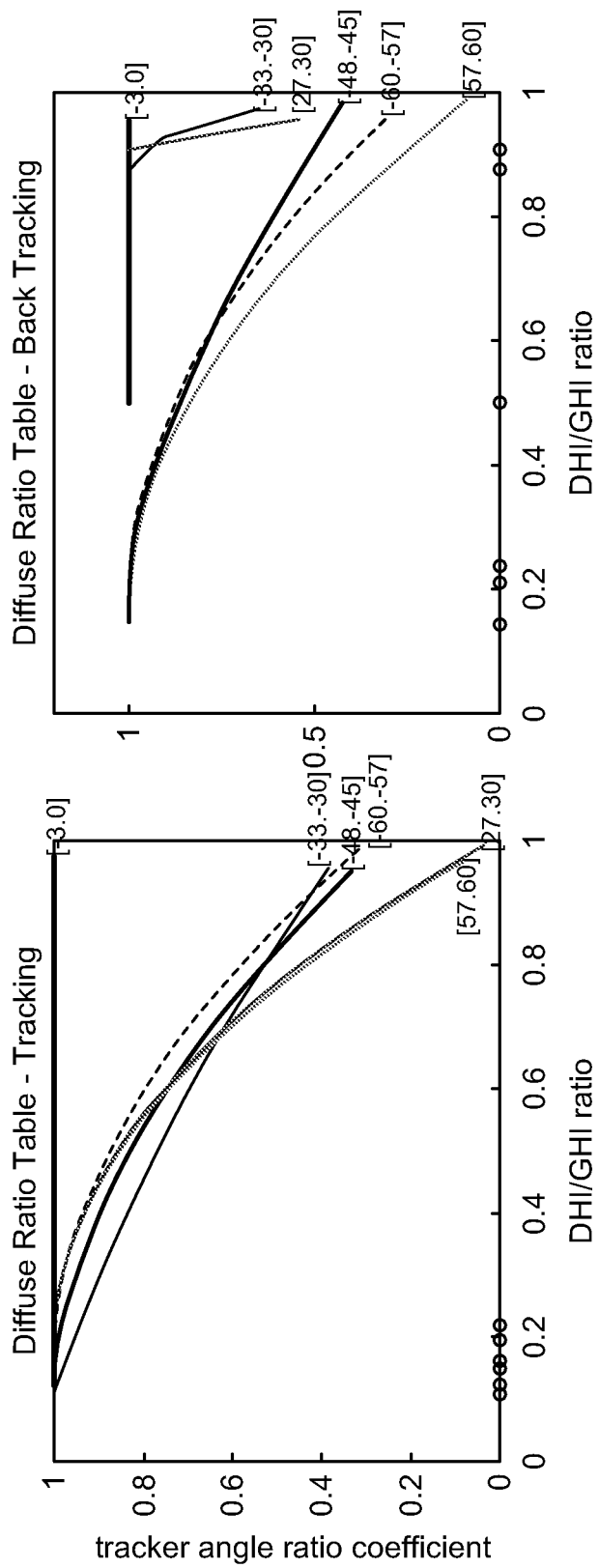

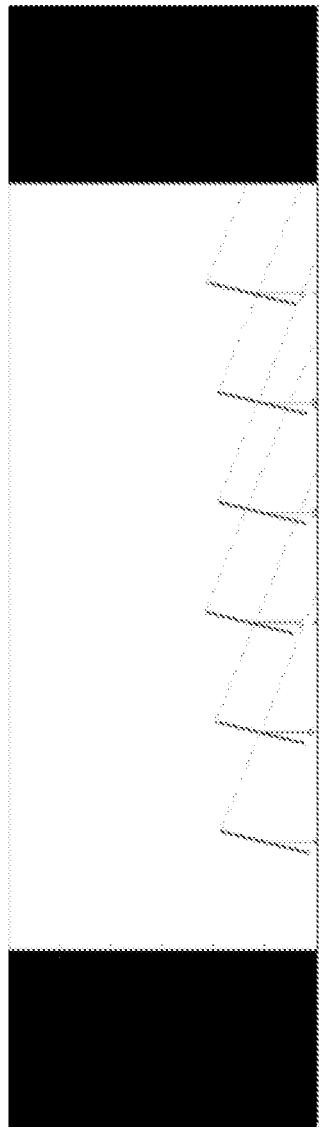
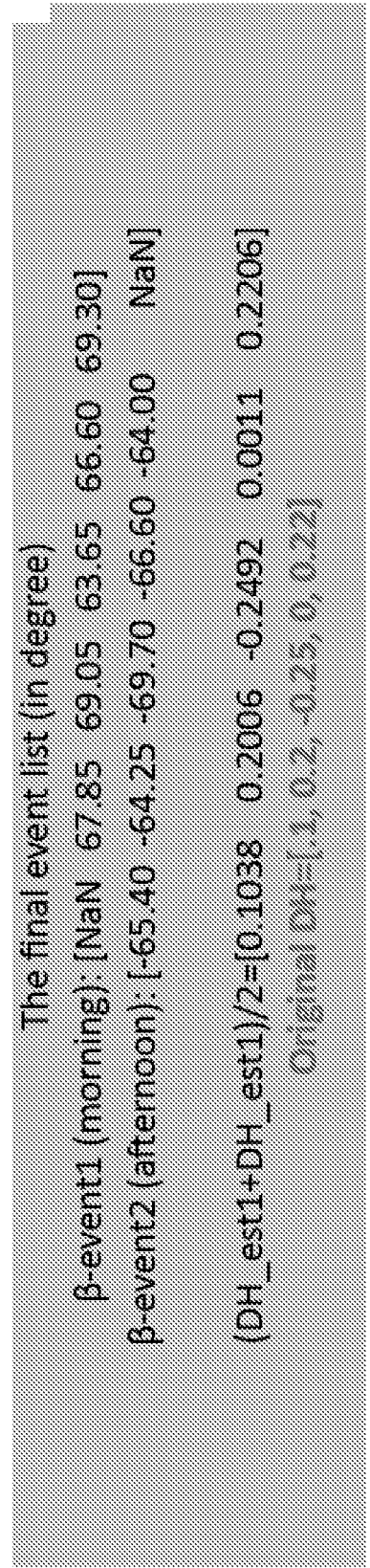
Using the other side: improve accuracy
The final event list (in degree)
β-event1 (morning): [NaN 67.85 69.05 63.65 66.60 69.30]
β-event2 (afternoon): [-65.40 -64.25 -69.70 -66.60 -64.00 NaN]
($DH\_est1+DH\_est1$)/2=[0.1038 0.2006 -0.2492 0.0011 0.2206]
Fig. 13

Random (order and DH) examples:

| Test # | Number of rows | Estimation Error (m) | Number of moves to estimate order (worst case) | Max DH |
|---|---|---|---|---|
| 1 | 30 | 0.0018 | 3 | 0.3 |
| 1 | 30 | 0.0018 | 0 | 0.3 |
| 1 | 30 | 0.0012 | 0 | 0.3 |
| 1 | 30 | 0.0015 | 3 | 0.3 |
| 1 | 30 | 0.0016 | 0 | 0.3 |
| 1 | 30 | 0.0015 | 0 | 0.5 |
| 1 | 30 | 0.0016 | 0 | 0.5 |

Fig. 16

Random (order and DH) examples:

| Test # | Number of rows | Estimation Error (m) | Number of moves to estimate order (worst case) | Max DH |
|---|---|---|---|---|
| 1 | 30 | 0.0011 | 10 | 0.1 |
| 1 | 30 | 0.0009 | 21 | 0.1 |
| 1 | 30 | 0.0011 | 8 | 0.1 |
| 1 | 60 | 0.0017 | 5 | 0.3 |
| 1 | 60 | 0.0016 | 0 | 0.3 |
| 1 | 60 | 0.0018 | 4 | 0.3 |
| 1 | 60 | 0.0016 | 0 | 0.5 |

Fig. 17

Simple Recursive Algorithm

```
estimated_order=zeros(1,plant.N)
[estimated_order,estimated_dh] = order_dh_estimation_v3(estimated_order,[],NaN,1);

function [out_list,dh_list] = order_dh_estimation(in_list,dh_list,marker,jglobal)
global deltaH_est1 deltaH_est2 plant %% find elements with marker or close to marker
if jglobal==1,
   Nlist=1:plant.N;
   reconstructed_position_sensor=Nlist(isnan(deltaH_est1));
elseif isnan(marker),
   out_list=[];
   if sum(in_list)==sum(1:plant.N)
      out_list=[out_list;in_list];
   end
   return
else
   % find corresponding element
   [sorted,j_sorted]=sort(abs(deltaH_est1-marker));
   reconstructed_position_sensor=j_sorted(sorted<0.009);
end
nt=length(reconstructed_position_sensor);
if nt>=1,
out_list=[];
   for k=1:nt
      if ~ismember(reconstructed_position_sensor(k),in_list), %% remove elements already explored
         temp=in_list;
         temp(jglobal)=reconstructed_position_sensor(k);
         marker=deltaH_est2(reconstructed_position_sensor(k));
         [out_list_temp,dh_list] = order_dh_estimation_v2(temp,dh_list,marker,jglobal+1);
         out_list=[out_list;out_list_temp];
      end
   end
else
   out_list=[];
end
end
```

Fig. 18

Sensitivity Beta-event to DH estimation

Recall: $f(\theta_1, \theta_2, \beta, \iota, dh) = 0$

Sensitivity $\dfrac{\partial dh}{\partial \beta}\bigg|_{\iota=0, \beta=\beta, dh=dh, \theta_1=\theta_1, \theta_1=\theta_2}$ Value: ~0.08 → 1 deg error in beta corresponds to 8 cm error in dh

*Quantization of 0.05 beta deg (0 sec) corresponds to quantization of ~ mm in dh*

Fig. 20

SYSTEMS FOR AND METHODS OF POSITIONING SOLAR PANELS IN AN ARRAY OF SOLAR PANELS TO EFFICIENTLY CAPTURE SUNLIGHT

TECHNICAL FIELD

This invention is related to energy conversion systems. More particularly, this invention is related to controlling solar tracking systems to efficiently capture solar radiation for conversion to electrical energy.

BACKGROUND

With the increasing recognition of the environmental affects and associated costs of burning fossil fuels, solar energy has become an attractive alternative. Solar tracking systems track the trajectory of the sun to more efficiently capture radiation, which is then converted to electrical energy. Solar tracking systems are less efficient when weather conditions change or when they do not account for local topographies that reduce the amount of light captured.

SUMMARY

In accordance with the principles of the invention, a solar tracking system is controlled by a global performance model based on the weather and topography local to the solar tracking system. In one embodiment, the performance model uses a machine-learning algorithm that periodically updates its parameters, learning from weather and topography data. In one embodiment, the solar tracking system comprises multiple rows of solar panel modules, forming a grid of rows of solar panel modules, where each row is independently orientatable to a solar source (e.g., the sun) relative to the other rows. As one example, each row of solar panel modules can be oriented at a different incident angle to the solar source than each of the other rows of solar panel modules is oriented to the solar source. The performance model optimizes the total output of the grid, which, due to interactions (couplings) between adjacent rows, does not necessarily correspond to optimizing the output from each individual row.

In one embodiment, the performance model is characterized by a polynomial, which determines orientations for each individual row of solar panel modules to optimize (e.g., maximize) the total energy output from the grid of solar panel modules. Preferably, the parameters of the performance model are determined based on the topography. The parameters are periodically updated based on weather conditions, such as forecast and historical weather data. In this way, the performance model is a learning model that continuously optimizes the solar tracking system to account for changing weather conditions.

In another embodiment, the performance model comprises a diffuse table, which correlates energy outputs for the solar tracking system to weather conditions.

In accordance with the invention, topography is determined using laser site survey, learned survey using energy readings on photovoltaics coupled to the solar panel modules, energy readings on the solar panel modules, airplane and drone imaging that correlates the position of the sun and resulting shading to topographic position, to name only a few examples. Weather conditions are determined using satellite weather forecasts informed by local data ("ground truth"), cameras looking at the sky, power measurements on the solar panel modules and voltage measurement on the photovoltaics.

The solar tracking system in accordance with the embodiments uses a mesh network that provides fail safe functionality.

BRIEF DESCRIPTION OF THE DRAWINGS

The following figures are used to illustrate embodiments of the invention. In all the figures, the same label refers to the identical or a similar element.

FIG. 6 is a graph of diffuse ratio table tracking, plotting tracker angle ratio coefficients versus DHI/GHI ratios, according to one embodiment of the invention.

FIG. 7 is a graph of diffuse ratio table backtracking, plotting tracker angle ratio coefficients versus DHI/GHI ratios, according to one embodiment of the invention.

FIGS. 10-23 show algorithms and results of using the algorithm to determine relative heights in accordance with one embodiment of the invention.

DETAILED DESCRIPTION

A solar tracking system in accordance with the principles of the invention more efficiently captures radiance for conversion to electrical energy. It will be appreciated that for large energy-generating systems, such as those generating hundreds of megawatts, a small percentage gain in efficiency translates to large gains in energy output.

In accordance with one embodiment, a solar tracking system comprising individual rows of solar panel modules adjusts each row independently of the others to provide more finely tuned tracking and also efficiently captures diffuse radiation to increase the total energy output by the system. Preferably, the solar tracking system is based on a performance model that is periodically tuned based on learning algorithms that compare predicted values (e.g., radiance incident on the solar panels or output generated at the solar panels) to the actual values and updates the performance model accordingly. In one embodiment, the performance model is generated by plotting weather conditions (e.g., ratios of diffuse fraction index to optimal diffuse gain or ratios of diffuse radiance to direct radiance) and fitting a curve (the performance model) to the data using regression. In another embodiment, this data is stored in a diffuse table.

Figure 1:
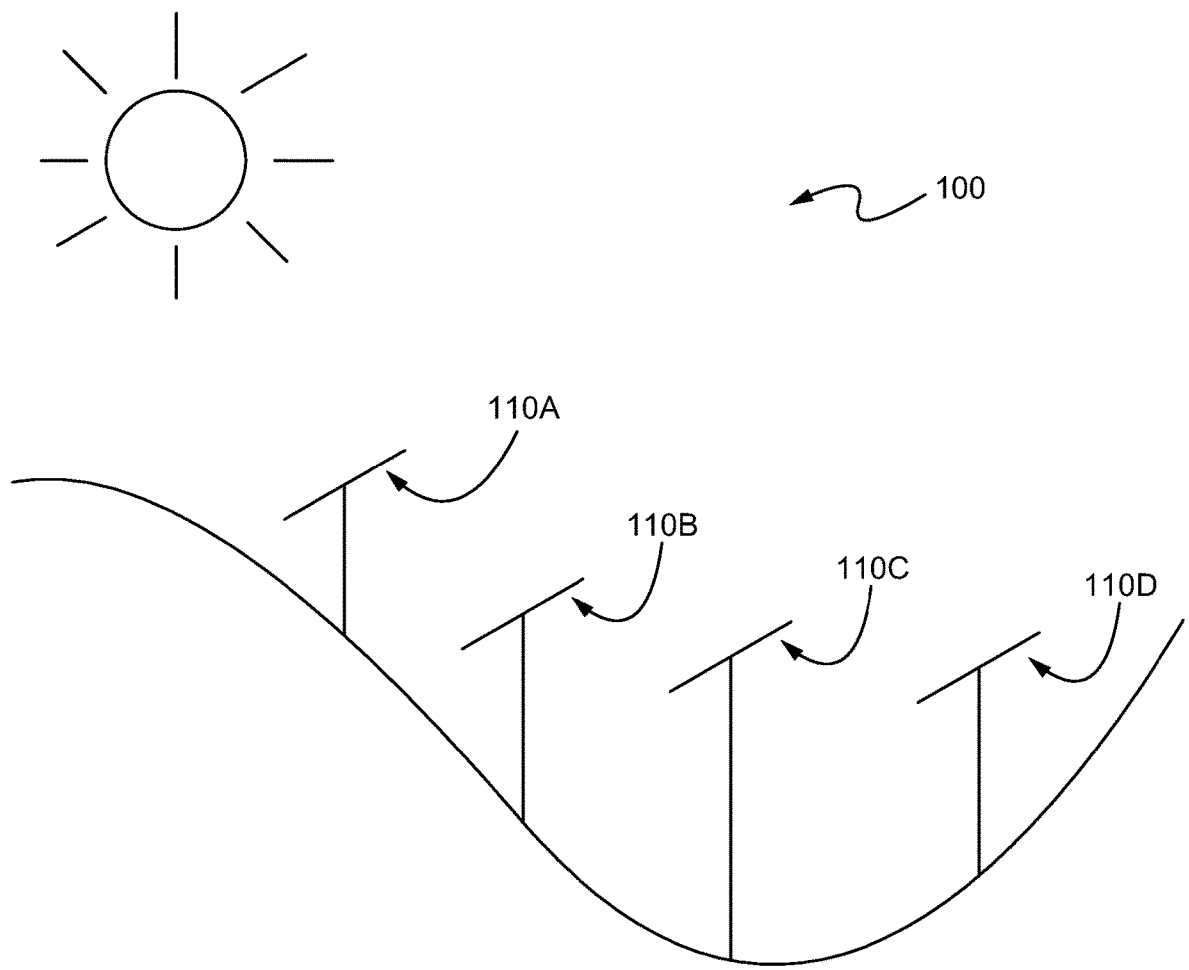
FIG. 1 shows a portion of a solar tracking system including multiple rows of solar panel modules.

FIG. 1 shows a portion of a solar tracking system 100 including multiple solar panels 110A-D forming a grid of solar panel modules, used to explain the principles of the invention. Each of the solar panel modules 110A-D has a light-collecting surface for receiving solar radiation, which is later converted into electricity for storage in a battery and for distribution to a load. Embodiments of the invention determine a performance model, predicting the output of the grid, used to orient each of the rows of solar panel modules to the sun or other radiation source to optimize the total energy output from the grid. Preferably, the performance module is determined from a topography of the area containing the grid, local weather conditions for each of the solar panel modules, or both. As one example, the performance model accounts for dependencies (coupling) between the rows (adjacent and otherwise) of solar panels. For example, if the row of solar panel modules 110A shades or partially shades the row of solar panel modules 110B, the two are said to be coupled. In other words, due to shading at a particular time of day or other relationships between the rows 110A and 110B, maximizing the global energy output by the entire grid does not necessarily correspond to maximizing the energy output by the row 110A and 110B. Instead, the global energy output might be maximized by coordinating the outputs, such as by orienting the row 110A to generate 80% of its maximum and the row 110B to generate 10% of its maximum. The performance model determines these coefficient or gains (and thus the orientation angles to the sun) for each of the all the rows in the system 100, including the rows 110A and 110B.

As used herein, in one embodiment, "orient" means to change an angle between the normal to a solar panel module and the line to the sun (the "incident angle"), to change any combination of x-y-z coordinates of a solar panel module with respect a fixed location (e.g., GPS location), to rotate the solar panel module along any of the x-y-z coordinate axes, or any combination of these. After reading this disclosure, those skilled in the art will recognize other ways to orient a row of solar panel modules to change an amount of radiation impinging on it and converted to electrical energy.

Figure 2:
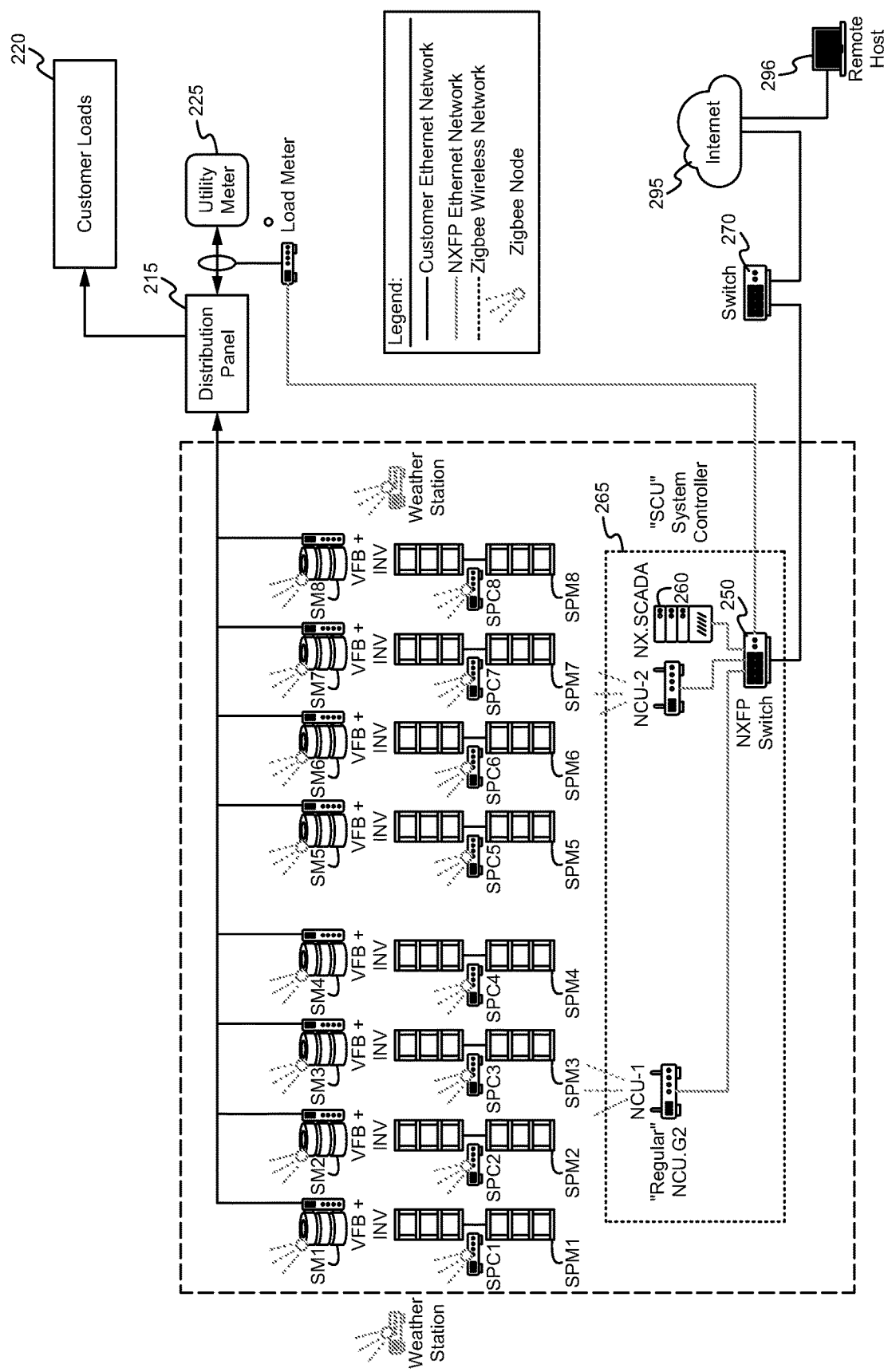
FIG. 2 shows a solar tracking system in accordance with one embodiment of the invention.

FIG. 2 shows a solar tracking system 200 in accordance with one embodiment of the invention. The solar tracking system 200 is a distributed peer-to-peer network. The solar tracking system 200 includes multiple rows of solar panel modules (SPMs) $SPM_1 \ldots SPM_8$, together forming a grid of solar panel modules. Each $SPM_i$ (here i=1 to 8, though other values are contemplated) is coupled to a corresponding self-powered controller ($SPC_i$) and drive assembly ($DA_i$, not shown). Each $SPC_i$ has logic for orienting its corresponding drive assembly ($DA_i$) and thus $SPM_i$ based on orientation commands. As one example, an $SPC_i$ receives an orientation command from a network control unit (described below) to orient an incident angle $\theta i$ between the $SPC_i$ and the sun. The corresponding drive assembly $DA_i$ positions the $SPM_i$ to the angle $\theta i$. Each of the rows $SPM_i$ 205$i$ is able to be oriented independently of the other rows.

Each of the rows of solar panel modules $SPM_i$ receives light, converts the light into electricity, and stores the electricity in a corresponding data storage medium, $SM_i$, for i=1 to 8. The storage media $SM_1 \ldots SM_8$ are ganged together and electrically coupled through a distribution panel 215 to customer loads 220. Network control units (NCU) $NCU_1$ and $NCU_2$ are each wirelessly coupled to one or more of the SPMs. As shown in FIG. 1, $NCU_1$ is wirelessly coupled to SPCs $SPC_1$ to $SPC_4$ and $NCU_2$ is wirelessly coupled to SPCs $SPC_5$ to $SPC_8$ $NCU_1$ and $NCU_2$ are both coupled over an Ethernet cable to an NXFP switch 250. The switch 250 couples $NCU_1$ and $NCU_2$ to a NX Supervisory Control and Data Acquisition (SCADA) 260, which in turn is couple to a switch 270 coupled to a remote host 296 over a network such as a cloud network. In some embodiments, the remote host 296 performs processing such as generating performance models, retrieving weather data, to name only a few such tasks. For ease of reference, the combination of $NCU_1$, $NCU_2$, NX SCADA 260 and NXFP switch 250 is referred to as an "SCU" system controller 265. Together, the components enclosed by the dotted line 280 are collectively referred to as "grid" or "zone" 280.

Preferably, each NCU in the zone 280 is coupled to each of the remaining NCUs in the zone 280, thereby forming a mesh architecture. Thus, if for any reason $NCU_1$ loses communication to the NX SCADA 260, $NCU_1$ can communicate with the NX SCADA 260 through $NCU_2$. In other words, each NCU in the zone 280 acts as a gateway to the NX SCADA 260 for any other NCU in the zone 280. This added redundancy provides a fail-safe network. In one embodiment, the NCUs in the zone 280 are wirelessly coupled to each other.

Each NCU in the zone 280 has added functionality. As some examples, the NCUs in the zone 280 together ensure that the performance model is globally optimized and the components in the zone 280 are operating properly. If, for example, $SPC_1$ instructs $NCU_1$ that it is shaded but, according to the performance model $SPC_1$ should not be shaded, the $NCU_1$ determines that an error has occurred. Each SPC also informs its associated NCU when it has changed its orientation. Using this information, the NCUs can thus keep track of the orientations of the solar panel modules $SPM_i$.

In accordance with one embodiment, if a row of solar panel modules suffers catastrophic failure and cannot communicate with its associated SCADA, the solar panel module enters a default mode. As one example, in default mode, an $SPM_i$ optimizes its energy conversion independently of the energy conversion for the entire grid.

It will be appreciated that FIG. 2 has been simplified for ease of illustration. In other embodiments, the zone 280 contains fewer, but preferably more, than 8 SPMs and 2 NCUs. In one embodiment, the ratio of SPCs to NCUs is at least between 50:1 to 100:1. Thus, as one example, during normal operation, $NCU_1$ communicates with $SPC_1$ through $SPC_{50}$, $NCU_2$ communicates with $SPC_{51}$ to $SPC_{100}$, etc.

In operation, a performance model is generated for each of the solar panel modules, based on the topography of the area containing a particular solar panel module, the weather local to the particular solar panel module, or both. In one embodiment, the weather comprises amounts of direct light, amounts of direct normal irradiance (DNI), global horizontal irradiance (GHI), diffuse horizontal irradiance (DHI), any combination of these, ratios of any two of these (e.g., DHI/GHI), or any function of these. After reading this disclosure, those skilled in the art will recognize functions of DNI, GHI, and DHI that can be used to generate performance models in accordance with the principles of the invention. By fitting the weather conditions to output, a base performance model is determined using regression or other curve-fitting techniques. It will be appreciated that each SPM has its own performance model, based, among other things, on its topography and local weather conditions. As explained below, each base performance model is then updated based on diffuse fraction sky.

As one example, the parameters of the base performance model are pushed to an SPC associated with a solar panel module $SPM_i$. These parameters reflect an orientation for a solar panel module if no adjustments based on "diffuse fraction" sky were needed. To account for diffuse radiation, parameters based on the diffuse angle adjustment are also sent to the particular $SPC_i$. As one example, the parameters for a base performance model indicate that, for global optimization of the performance model, a solar panel module should be oriented at an incidence angle of 10 degrees. Diffuse angle adjustor data indicate that 10 degrees is not optimal for this SPM, but instead 70% (a factor of 0.7) of this angle should be used. Thus, the diffuse angle adjustor (gain factor) of 0.7 is pushed to the particular solar panel. When the particular SPC receives both parameters, it orients its associated solar panel to an incidence angle of (0.7)*(10 degrees)=7 degrees. Preferably, the diffuse angle adjustment is performed periodically, such as once every hour, though other periods are able to be used.

Some embodiments of the invention avoid shading in the morning, by using backtracking. The performance model thus generates some gains (e.g., target angles for orienting an SPM) for early morning tracking (to avoid shading) and another gain for other times. The system in accordance with these embodiments are said to operate in two modes: regular tracking and backtracking. That is, the system uses a backtracking algorithm (performance model) at designated times in the early morning and a regular tracking algorithm at all other times.

The performance model differentiates between forecasted weather and instantaneous weather. For example, an instantaneous change in weather (e.g., a momentary drop in radiance) may be attributable to a passing cloud rather than an actual change in weather. Thus, preferably the performance model gives more weight to forecasted weather.

Figure 3:
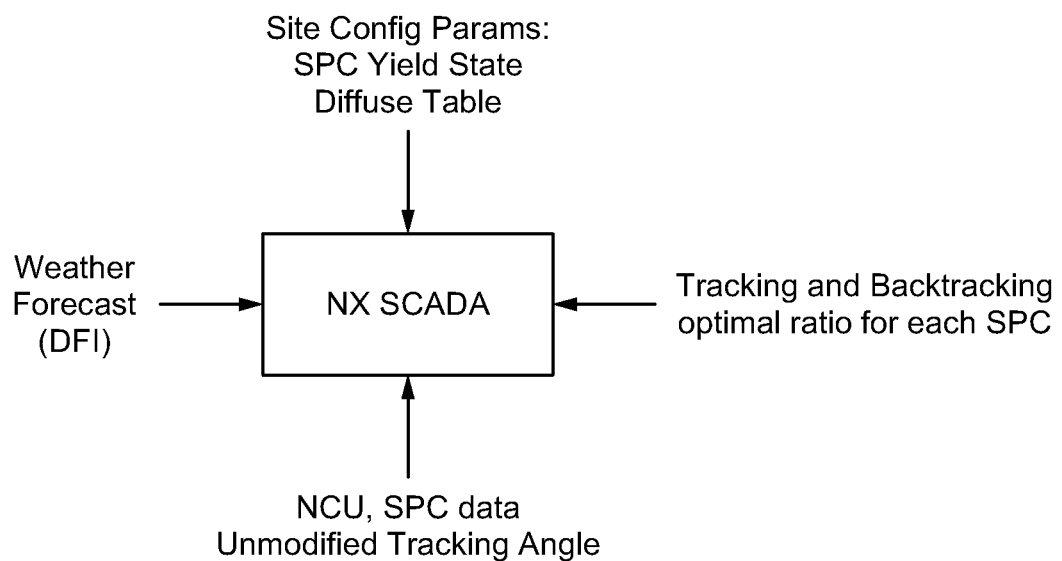
FIG. 3 is a block diagram of a diffuse control architecture NX Supervisory Control and Data Acquisition (SCADA) in accordance with one embodiment of the invention.

FIG. 3 is a block diagram of a diffuse control architecture NX SCADA 300 in accordance with one embodiment of the invention. The NX SCADA 300 receives as input weather forecast (e.g., DFI), NCU and SPC data (unmodified tracking angle), site configuration parameters (e.g., SPC Yield state and Diffuse table) and outputs tracking and backtracking optimal ratios for each SPC. A diffuse table in accordance with one embodiment of the invention plots optimal diffuse gain versus diffuse fraction indexes for determining a performance model.

Figure 4:
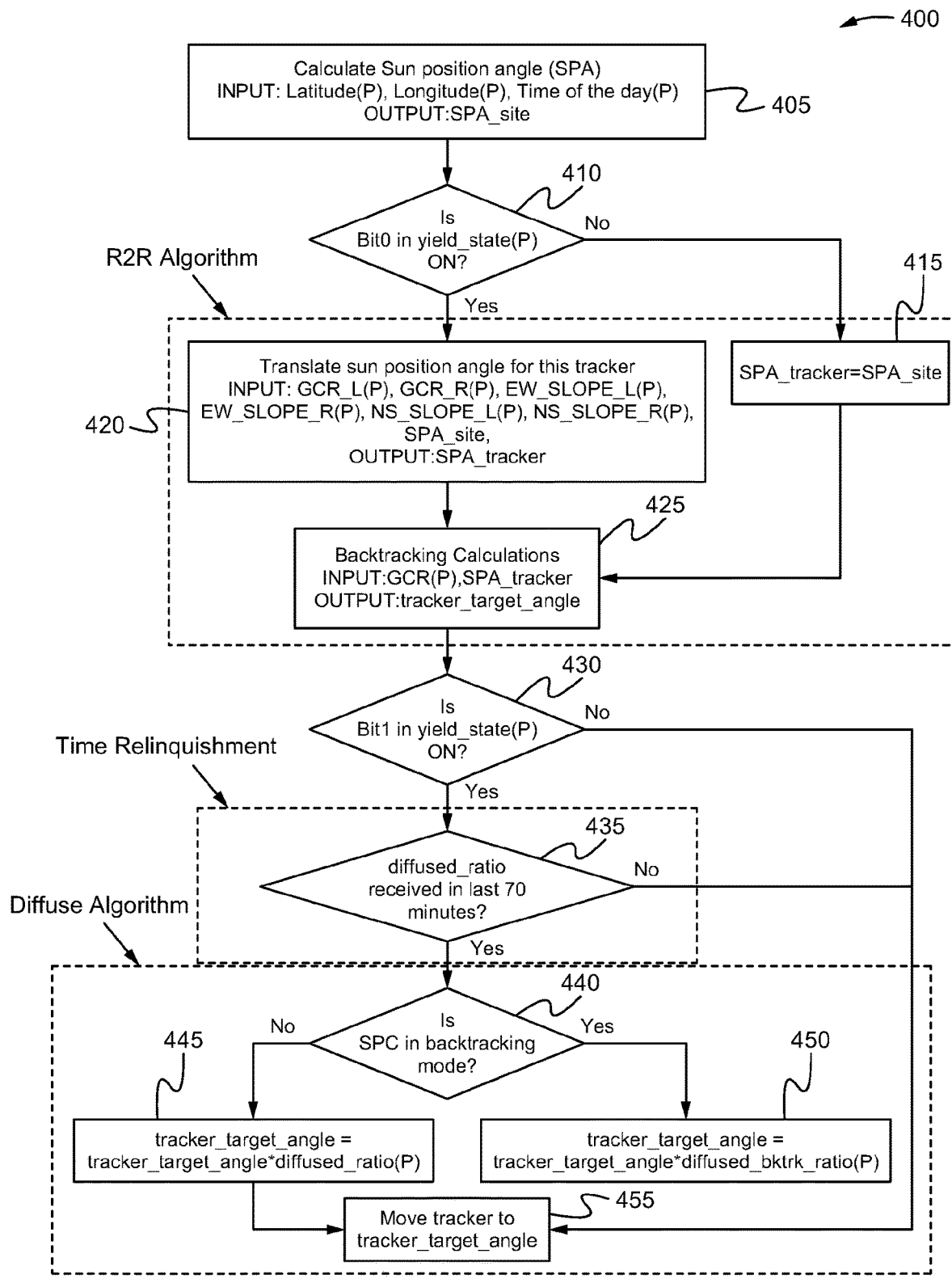
FIG. 4 shows the steps of a process, an enhanced tracking algorithm, for determining parameters of a global optimal performance model for a solar grid in accordance with one embodiment of the invention.

FIG. 4 shows the steps 400 of a process for determining parameters for performance models in accordance with one embodiment of the invention. Though the process is performed for each row of solar panels in a grid, the following explanation describes the process for a single row of solar panel modules in a grid. It will be appreciated that the process will be performed for the remaining rows of solar panel modules. First, in the step 405, the sun position angle (SPA) is calculated from the latitude and longitude for the particular row of solar panel modules and the time of day. Next, in the step 410, it is determined whether the Bit0 in the yield state is ON. Here, Bit0 and Bit1 are a two-bit sequence (Bit0Bit1) used to describe which of a possible 4 modes the solar tracker is in: Bit0=0/1 corresponds to row-to-row (R2R) tracking being OFF/ON, and Bit1=0/1 corresponds to diffuse tracking being OFF/ON. Thus, for example, Bit0Bit1=01 corresponds to R2R tracking OFF and diffuse tracking ON, Bit0Bit1=10 corresponds to R2R tracking ON and diffuse tracking OFF, etc. In other embodiments, Bit0=1/0 corresponds to R2R tracking being OFF/ON and Bit1=1/0 corresponds to diffuse tracking is OFF/ON. The designations are arbitrary.

If Bit0 is not ON, the process proceeds to the step 415 in which SPA_Tracker is set to the SPA_Site, and continues to the step 425. If, in the step 410, it is determined that the Bit0 in the yield state is ON, then the process continues to the step 420, where the SPA for the tracker is translated, from which the process continues to the step 425. In the step 425, "backtracking" is calculated. From the step 425, the algorithm proceeds to the step 430, in which it is determined whether Bit1 in the yield state is ON. If Bit1 is ON, the process continues to the step 435; otherwise, if Bit1 in the yield state is OFF, the process continues to the step 455.

In the step 435, the process determines whether a diffused ratio has been received in the last 70 minutes. If a diffused ratio has been received in the last 70 minutes, the process continues to the step 440; otherwise, the process continues to the step 455. In the step 440, the process determines whether the particular SPC is in the backtracking mode. If it determined that the SPC is not in the backtracking mode, the process continues to the step 445; otherwise, the process continues to the step 450. In the step 445, the tracker target angle is set to (tracker target angle)*diffused ratio. From the step 445, the process continues to the step 455. In the step 450, the target tracker angle is set to (target tracker angle)*diffused_backtrack_ratio. From the step 455, the process continues to the step 455. In the step 455, the tracker is moved to the target tracker angle.

As shown in FIG. 4, the steps 415, 420, and 425 form the R2R algorithm; the step 435 forms a "time relinquishment" algorithm; and the steps 440, 445, 450, 455 form the diffuse algorithm. In FIG. 4, for the time relinquishment, if no diffuse ratio is received within the last 70 minutes, the ratios are set to 1.

Those skilled in the art will recognize that the steps 400 are merely illustrative of one embodiment of the invention. In other embodiments, some steps can be added, other steps can be deleted, the steps can be performed in different orders, and time periods (e.g., 70 minutes between diffuse adjustments) can be changed.

Figure 5:
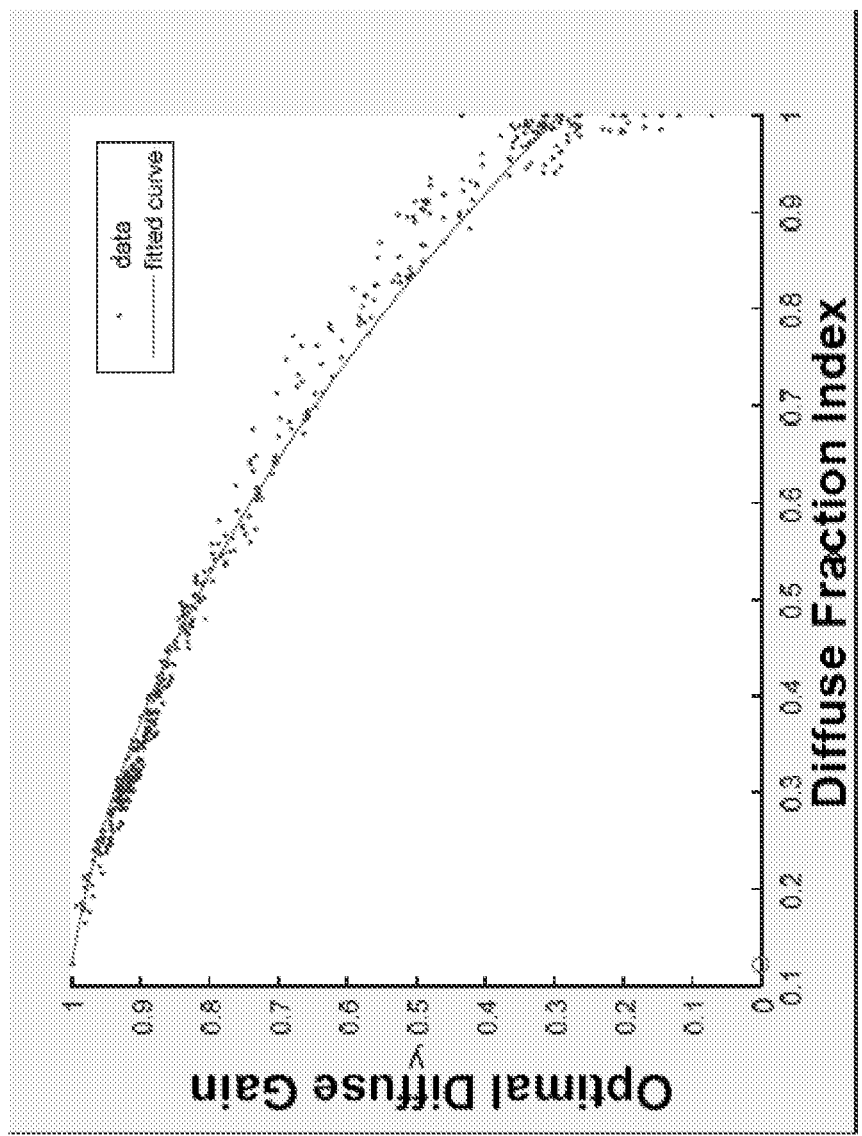
FIG. 5 is a diffuse table generated from yearly data, according to one embodiment of the invention.

FIG. 5 is a diffuse table generated from yearly data, according to one example, plotting optimal diffuse gain versus diffuse fraction index.

FIG. 6 is a graph of a final diffuse ratio table for tracking, plotting tracker angle ratio coefficient versus DHI/GHI ratios, according to one embodiment of the invention. FIG. 7 is a graph of a final diffuse ratio table for backtracking, plotting tracker angle ratio coefficient versus DHI/GHI ratios, according to one embodiment of the invention.

Figure 8:
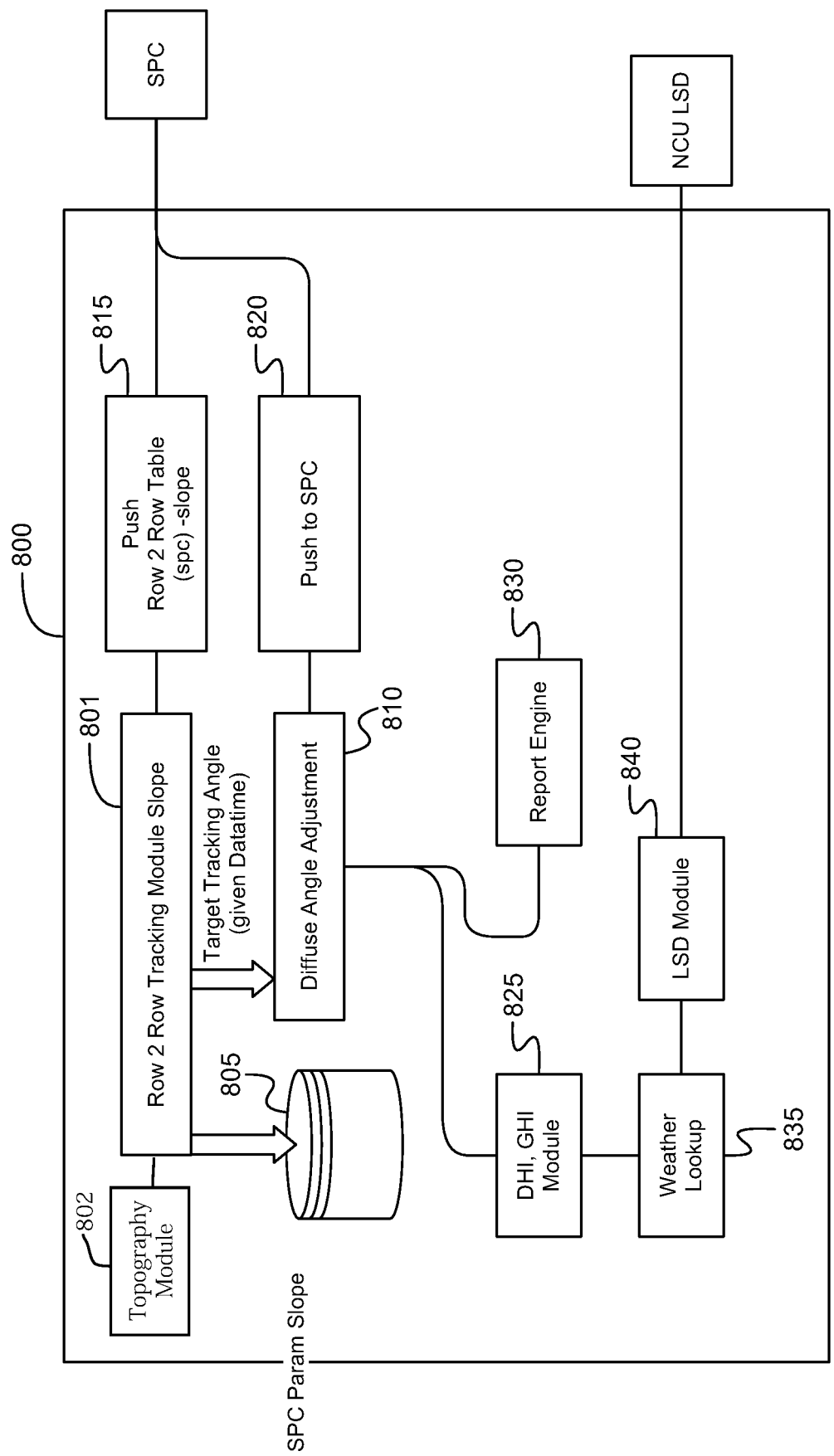
FIG. 8 shows the components of a SCADA in accordance with one embodiment of the invention.

FIG. 8 shows a SCADA 700 in accordance with one embodiment of the invention. The SCADA 800 comprises a row-to-row (R2R) tracking module 801, storage 805, a diffuse angle adjustor 810, first and second transmission modules 815 and 820, a DHI-GHI module 825, a weather lookup module 835, and a report engine 830. The R2R tracking module 801 is coupled to the storage 805, the diffuse angle adjustor 810, and the first transmission module 815. The R2R tracking module 801 tracks the slopes of solar panel modules at their locations, stores the slopes in the storage 805, sends target tracking angles (for given dates and times) to the diffuse angle adjustor 810, and transmits the slopes to the first transmission module 815 for pushing to the SPCs. The weather lookup module 835 collects weather data for the DHI-GHI module 825, which provides the weather data to the diffuse angle adjustor 810. The diffuse angle adjustor transmits the diffuse angles to the second transmission module 820, which pushes the data to its associated SPC, and also to the report engine 830. The local sensor data (LSD) module 840 receives local sensed weather data (e.g., weather, wind, or other local sensed data) from the NCUs and pushes the data to the weather lookup module 835.

A topography module 802 is configured to store maps and communicate topographical information to the R2R tracking module 801. The information may be used to compute the row-to-row table. It is contemplated that the R2R tracking module 801 may include a topography module 802. The information stored in the topography module 802 may updated on a periodic basis. The topographical information can be determined, for example, using laser site surveys, learned surveys using photovoltaics on SPCs, closed-loop readings on the solar panel modules, or airplane or drone imaging.

As explained above, preferably the SCADA 800 pushes not the "optimal" angle for each individual SPA, but the angle that optimizes the total global energy output. The diffuse angle adjustor 810 pushes not an angle but a ratio (e.g., 70%, a "gain factor"). In a preferred embodiment, SCADA 800 is configured to transmit two gains: a gain for regular tracking and a gain for "backtracking," that is, a gain to avoid shading during early morning hours. Thus, in accordance with one embodiment, the SCADA 800 determines the time of day and thus whether to generate a regular tracking gain or a backtracking gain, which is pushed to the SPCs.

Figure 9:
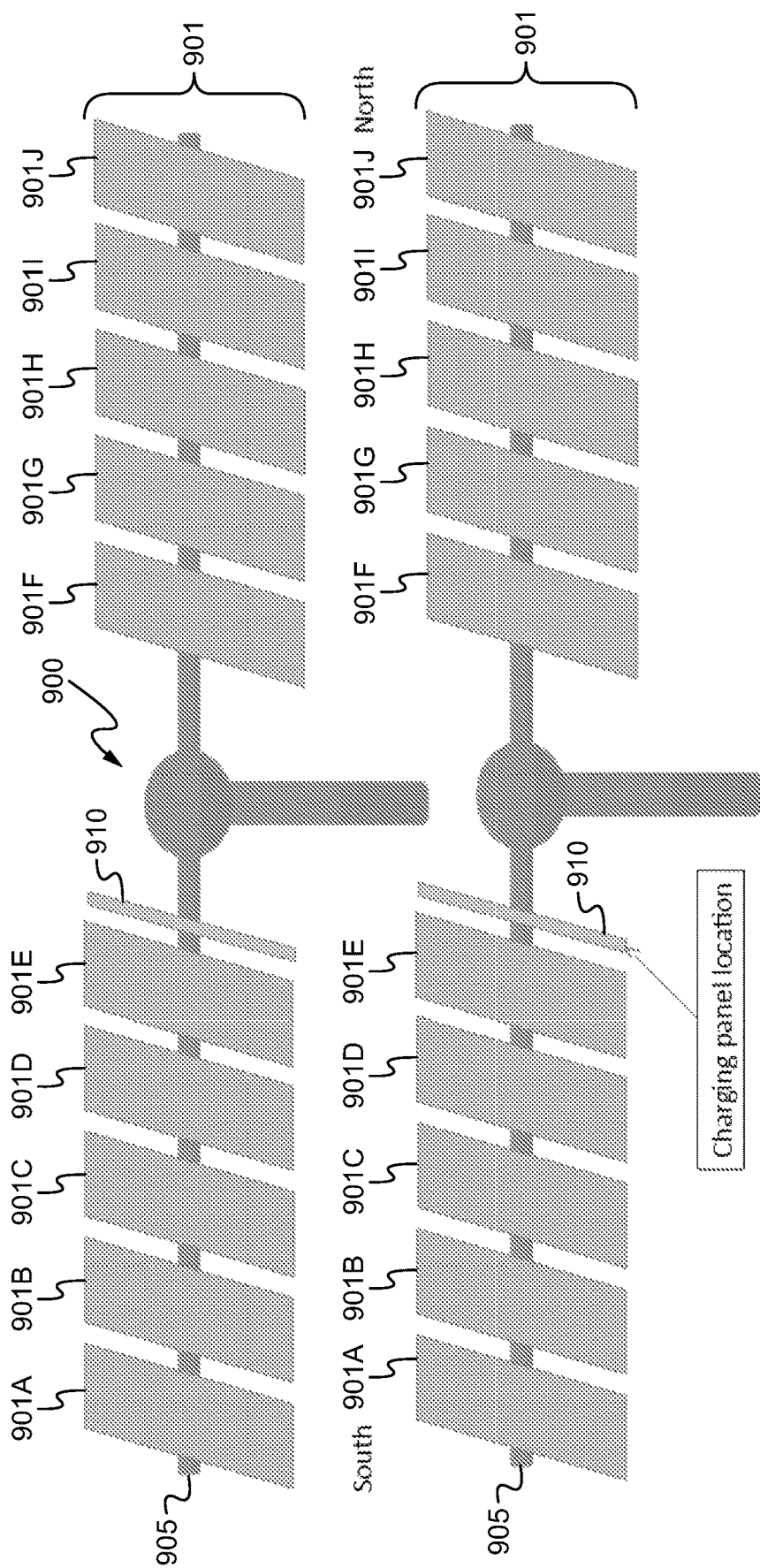
FIG. 9 shows a configuration comprising a row of solar panel modules and a "skinny solar panel" used to determine relative heights of multiple SPMs using shading, in accordance with one embodiment of the invention.
Figure 10:
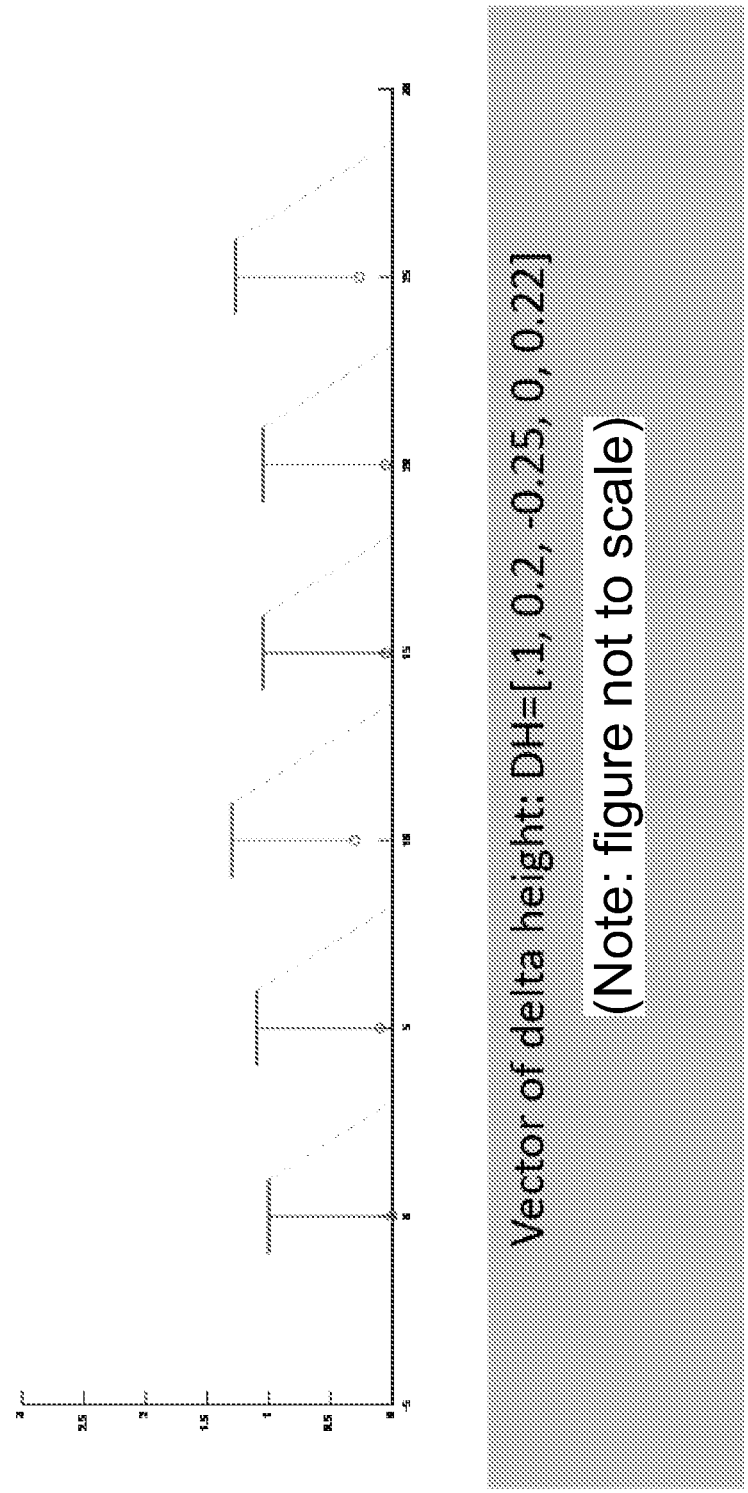
Figure 11:
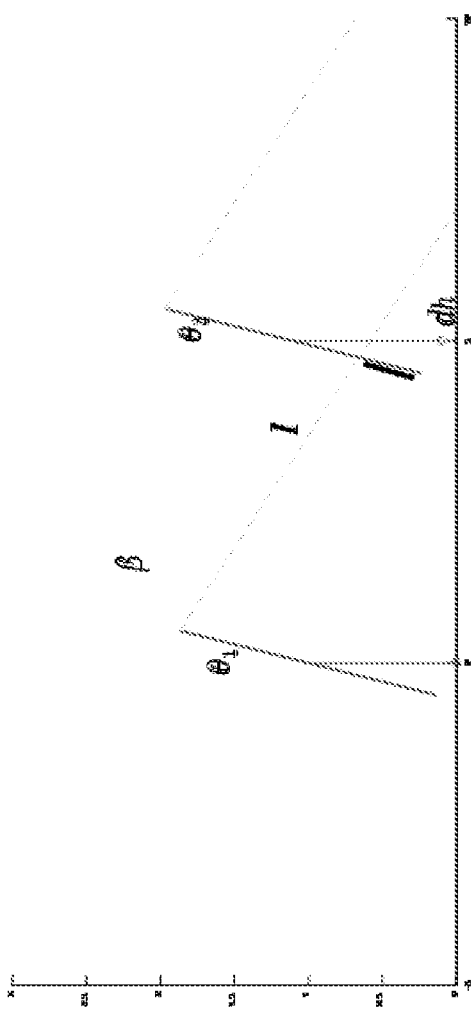
Figure 12:
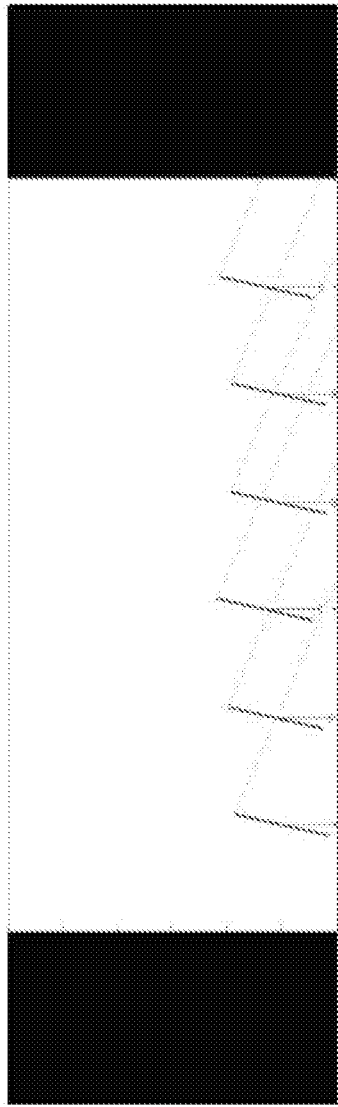
Figure 14:
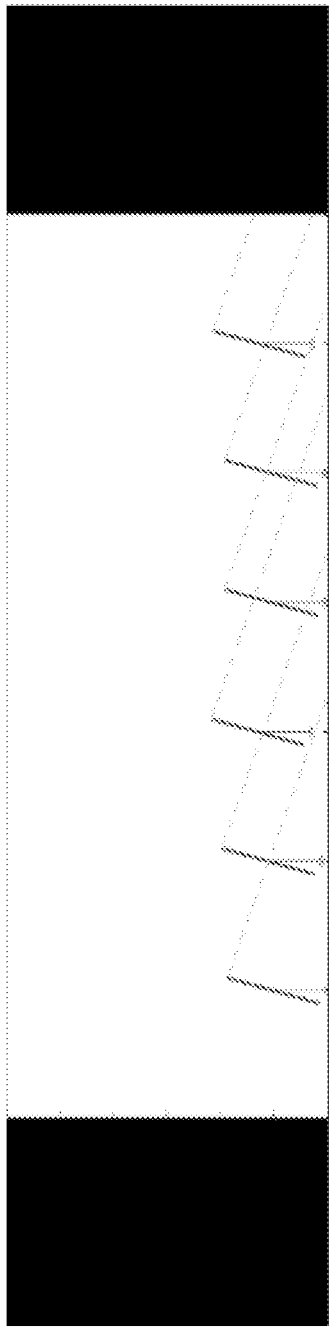
Figure 15:
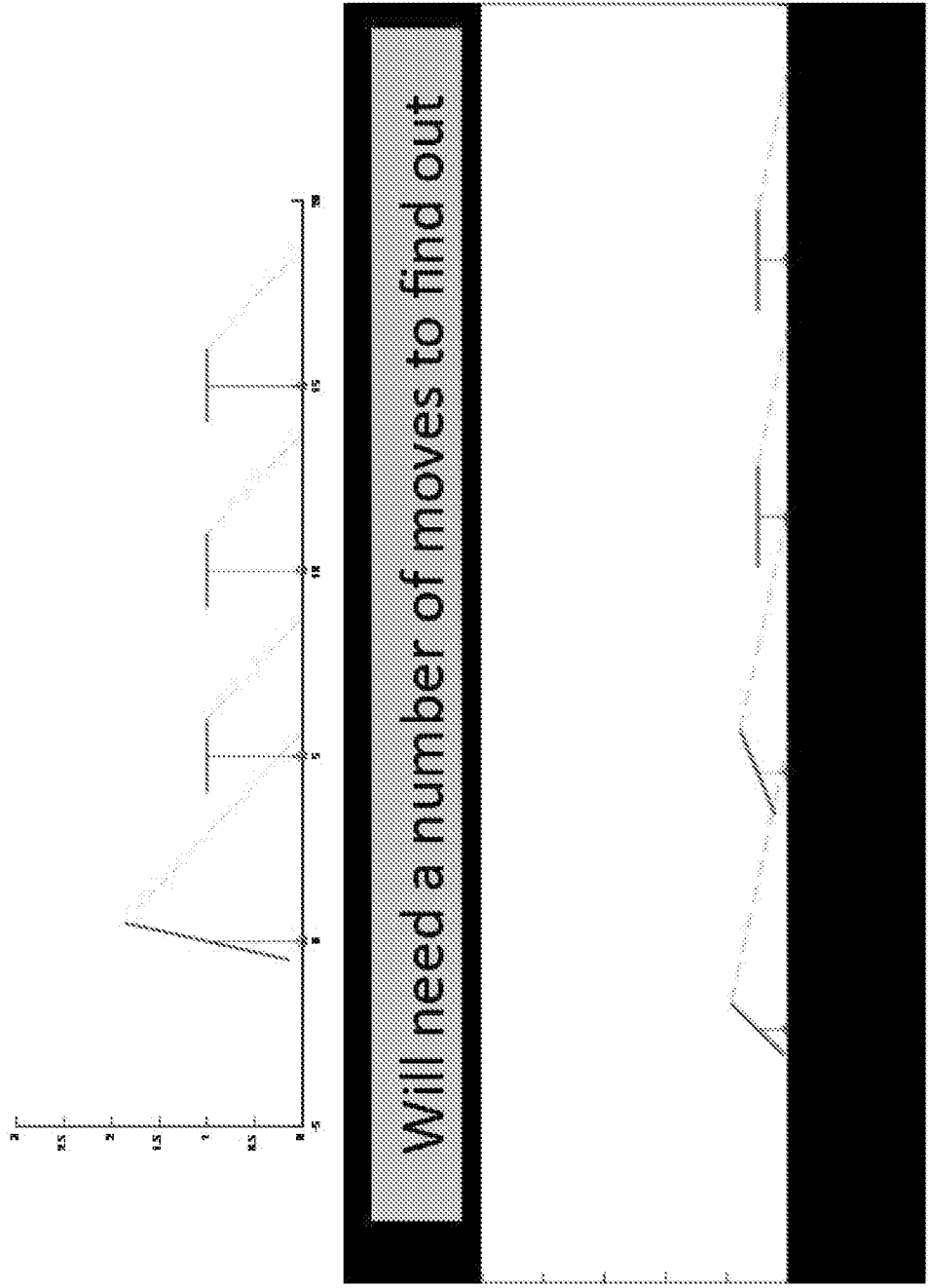
Figure 19:
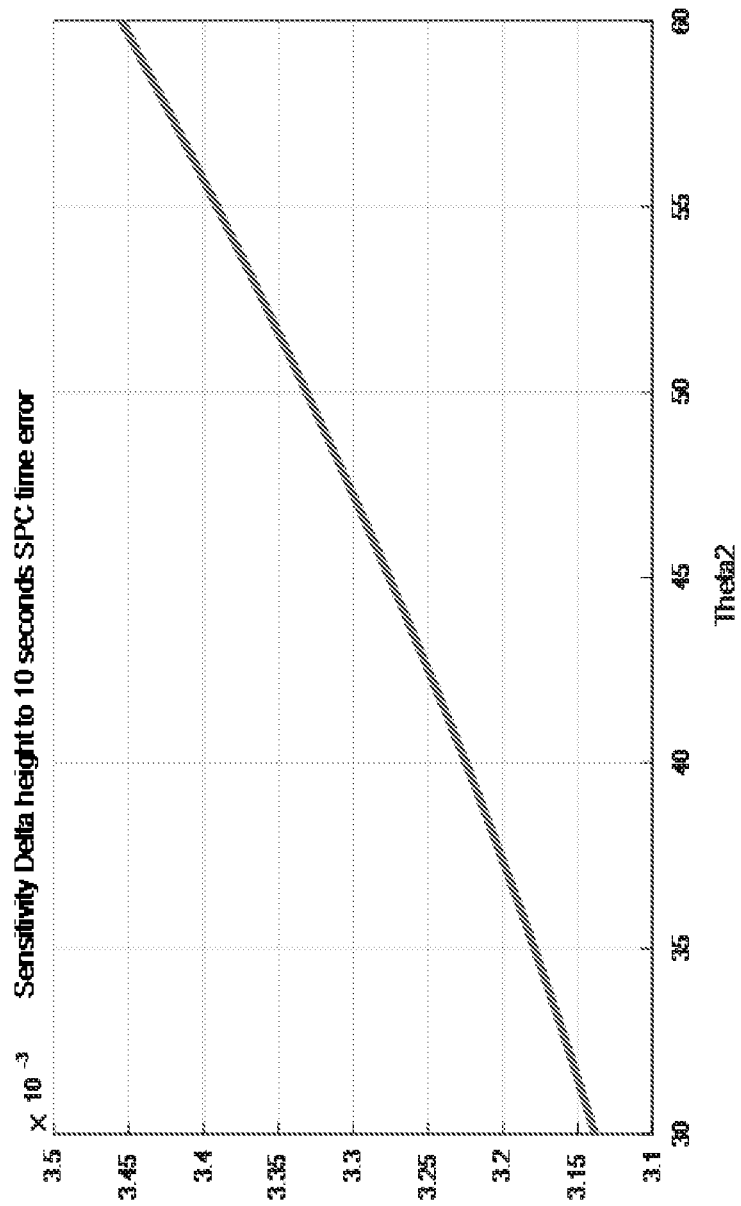
Figure 21:
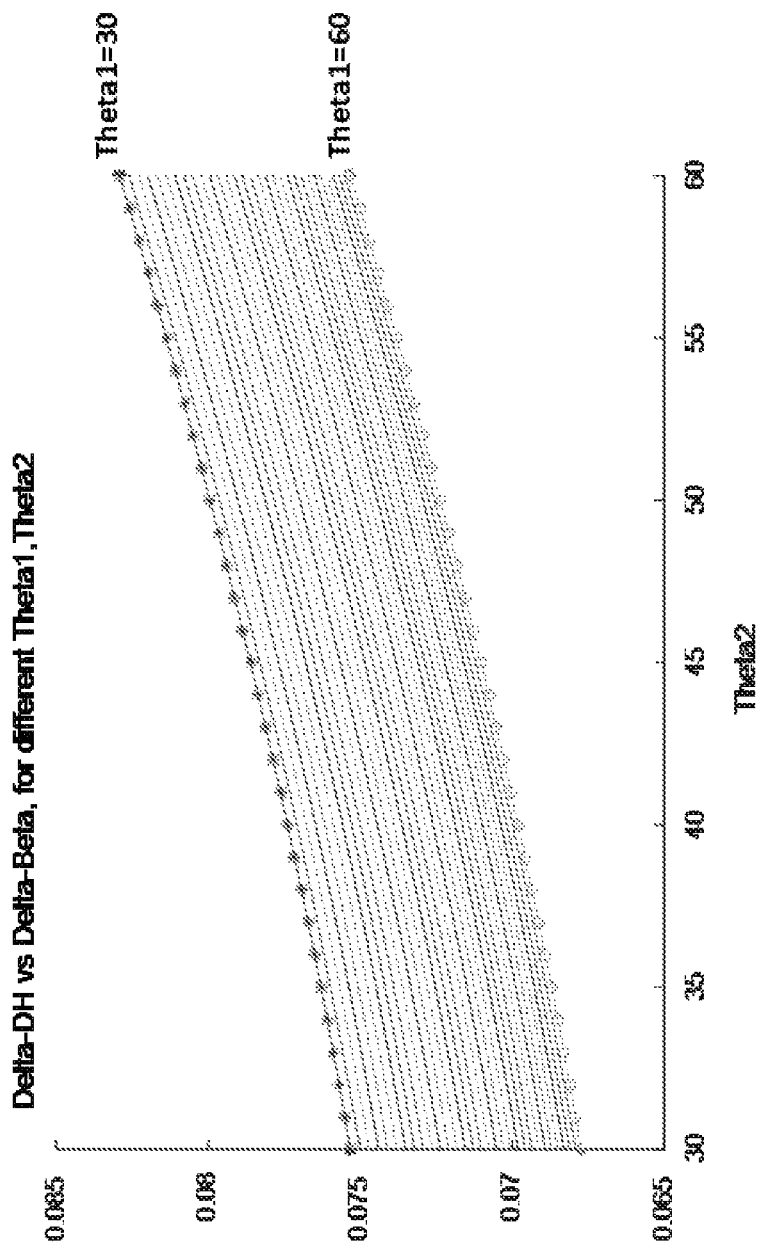
Figure 22:
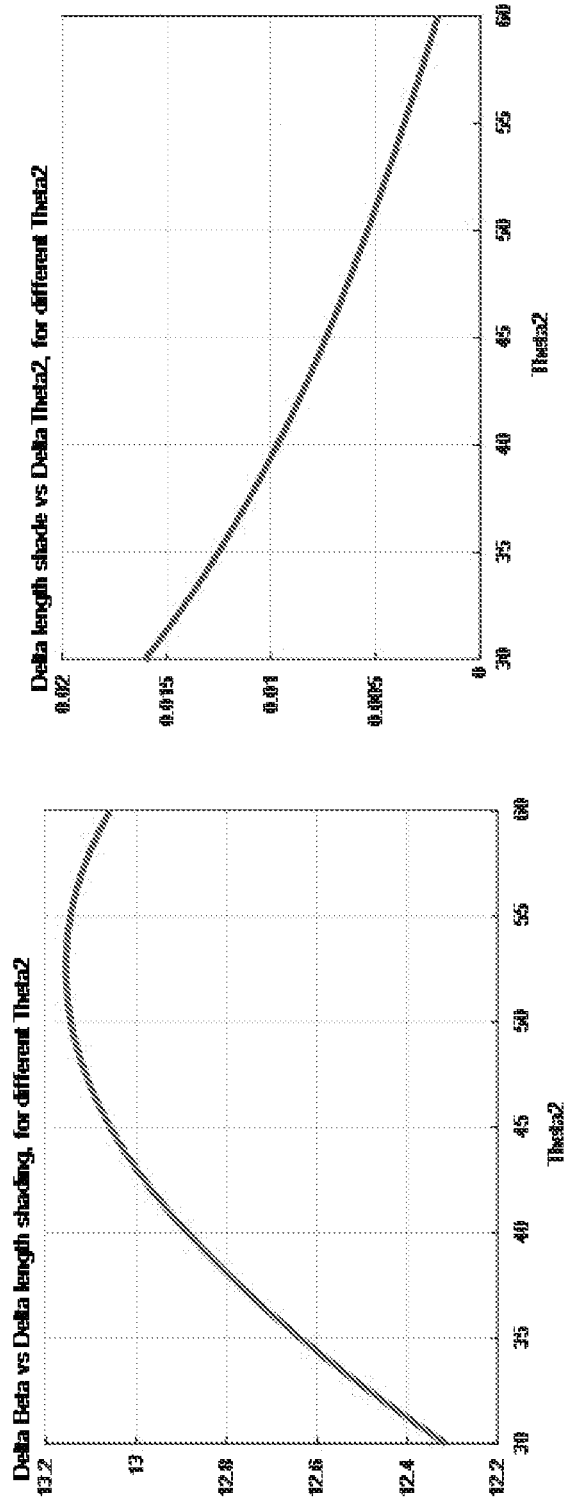
Figure 23:
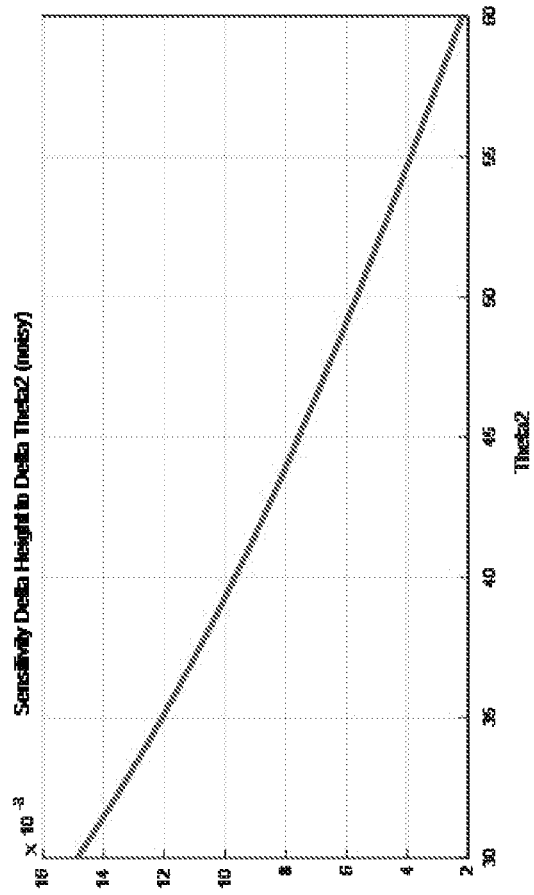

As explained above, in one embodiment a topology for each SPM is determined from shading between SPMs (adjacent and otherwise) using small solar panels ("skinny solar panels") each coupled to or integrated with a self-powered controller (SPC) on an SPM as described above or otherwise coupled to the SPM. As used herein, a skinny solar panel, like individual solar panels in an SPM, is able to read an amount of radiation (e.g., solar radiation) striking its surface. Like an SPM, this amount of radiation is able to be related to an orientation (e.g., incidence angle) of the surface to a solar source. FIG. 9 shows a torque tube supporting both a skinny solar panel 910 and a row of solar panel modules 901, the SPM 901 comprising individual solar panels 901A-J. The torque tube is coupled to a drive assembly (not shown) for orienting (here, rotating) radiation-collecting surfaces of the SPM 901 and the skinny solar panel 910 to the solar source.

In one embodiment, the skinny solar panel 910 determines shading between SPMs and thus their relating heights. In this way, "height profiles" can be estimated. Below, β-events refer to a panel no longer being shaded. For example, when a first of the SPMs moves, a β-event can be triggered to show that other panels are no longer shaded. These shading events can determine relative heights and the order (sequence) of SPMs. FIGS. 10-23 are used to explain this determination in accordance with one embodiment of the invention.

FIG. 11-17 show, among other things, how simple trigonometry can be sued to determine relative heights (dh). FIG. 18 shows a simple recursive algorithm for determining relative heights. FIGS. 19-23 show the results of using this algorithm in accordance with one embodiment of the invention.

In different embodiments, a skinny solar panel is the same as or forms part of a photovoltaic that powers an SPC or is a component separate from the photovoltaic that powers an SPC. Thus, photovoltaics different from skinny solar panels can be used in accordance with FIGS. 9-23 to determine relative heights and ordering between SPMs are described herein.

In a preferred embodiment, the logic of a solar tracking system in accordance with the present invention is distributed. For example, referring to FIG. 2, a base performance model is generated at SCADA 260 or at a central location coupled to the SCADA 260 over a cloud network. Diffuse adjustments (e.g., gains) are determined at the SCADA 260. Actual target angles for each SPC are determined at the associated SPCs based on the gains.

Using the cloud network, the SCADA 260 is able to receive weather forecasts, share information from the cloud to the NCUs and SPCs in the zone 280, offload computational functionality to remote processing systems, or any combination of these or any other tasks.

In operation of one embodiment, a global optimal performance model is generated for a solar tracking system in two stages. In the first stage, a detailed site geometry (topography) of the area containing the solar tracking system is determined. This can be determined using laser site surveys, learned surveys using photovoltaics on SPCs, closed-loop readings on the solar panel modules, or airplane or drone imaging.

As some examples, topography for the area containing an SPC is determined by orienting a photovoltaic on the SPC to the known location of the sun. The energy readings compared to the known location of the sun can be used to determine a position of the associated solar panel, including any one or more of its x-y-z coordinates relative to a fixed point (i.e., its GPS coordinates) or its grade/slope relative to normal or another fixed angle, to name only a few such coordinates. The solar panels can be oriented in similar ways and their local topographies similarly determined. In yet another embodiment, a separate sensing panel is installed on each row of solar panel modules. By adjusting the orientation of a sensing panel with respect to the sun, based on the time of day (i.e., angle of the sun) and outputs generated on the sensing panel, the relative positions of adjacent rows of solar panel modules can be determined. In still another embodiment, x-y-z coordinates of the edges of the rows of solar panel modules are physically measured.

In a second stage, periodic adjustments are made to the parameters of the performance model, such as by using weather conditions (e.g., forecast and historical conditions), using, for example, satellite weather forecasts, cameras trained to the sky, power measurements on the solar panel modules, and voltage measurement from the SPCs.

It will be appreciated that each of the SPCs, NCUs, and SCADA described herein comprises memory containing computer-executable instructions and a processor for performing those instructions, such as disclosed herein.

It will be appreciated that solar grids are able to span large areas, such that different portions of the solar grid experience different weather conditions. In accordance with embodiments of the invention, performance models are generated for each solar panel module and updated based on weather conditions local to each.

Those skilled in the art will recognize that various modifications can be made to the disclosed embodiments without departing from the scope of the invention. As one example, while the embodiments disclose multiple rows of solar panel modules, each row can be replaced by a single elongated solar panel module. Further, while the examples describe the radiation source as the sun, other radiation sources are contemplated by the principles of the invention, such as thermal radiation sources.

Systems for and methods of generating performance models are disclosed in U.S. patent application Ser. No. 14/577,644, filed Dec. 19, 2014, and titled "Systems for and Methods of Modeling, Step-Testing, and Adaptively Controlling In-Situ Building Components," which claims priority to U.S. provisional patent application Ser. No. 61/919,547, filed Dec. 20, 2013, and titled "System, Method and Platform for Characterizing In-Situ Building and System Component and Sub-component Performance by Using Generic Performance Data, Utility-Meter Data, and Automatic Step Testing," and U.S. provisional patent application Ser. No. 62/022,126, filed Jul. 8, 2014, and titled "System, Method and Platform for Automated Commissioning in Commercial Buildings," all of which are hereby incorporated by reference.

Systems for and methods of self-powering solar trackers are disclosed in U.S. patent application Ser. No. 14/972,036, filed Dec. 16, 2015, titled "Self-Powered Solar tracker Apparatus," which is hereby incorporated by reference.

Systems for and methods of row-to-row tracking are disclosed in U.S. Patent application Ser. No. 62/492,870, filed May 1, 2017, and titled "Row to Row Sun Tracking Method and System," which is hereby incorporated by reference.

Tracking systems are described in U.S. patent application Ser. No. 14/745,301, filed Jun. 19, 2015, and titled "Clamp Assembly for Solar Tracker," which is a continuation of U.S. patent application Ser. No. 14/489,416, filed Sep. 17, 2014, and titled "Clamp Assembly for Solar Tracker," which is a continuation in part of U.S. patent application Ser. No. 14/101,273, filed Dec. 9, 2013, and titled, "Horizontal Balanced Solar Tracker," which claims priority to U.S. Patent application Ser. No. 61/735,537, filed Dec. 10, 2012, and titled "Fully Adjustable Tracker Apparatus," all of which are hereby incorporated by reference.

What is claimed is:

1. A solar tracking system comprising:
    multiple rows of solar panel modules forming a grid of solar panel modules, wherein the multiple rows of solar panel modules are orientable to a solar source independently of each other; and
    a control system configured to orient each of the multiple rows of solar panel modules to the solar source independently of each other based on a performance model to optimize an energy output from the grid of solar panel modules, wherein the performance model predicts an energy output from the grid of solar panel modules based on an orientation of each of the multiple rows of solar panel modules to the solar source and first data including weather conditions local to each of the multiple rows of solar panel modules,
    wherein the performance model is calibrated based on outputs of the multiple rows of solar panel modules and on shading between the multiple rows of solar panel modules, and
    wherein the shading is determined by skinny solar panels coupled to each of the multiple rows of solar panel modules.

2. The solar tracking system of claim 1, wherein the first data further comprise a predicted amount of irradiance upon each of the multiple rows of solar panel modules.

3. The solar tracking system of claim 2, wherein the irradiance includes diffuse light.

4. The solar tracking system of claim 2, wherein the predicted amount of irradiance is a function of global horizontal irradiance (GHI), direct normal irradiance (DNI), diffuse horizontal irradiance (DHI), ground reflected radiation, or any combination thereof.

5. The solar tracking system of claim 1, wherein each of the multiple rows of solar panel modules ($SPM_i$) includes a corresponding self-powered controller ($SPC_i$), a drive assembly ($DA_i$), and a photovoltaic ($PV_i$), for i=1 to X.

6. The solar tracking system of claim 5, wherein the control system includes multiple network control units ($NCU_j$) each coupled to a corresponding one or more of the $SPC_i$, for i=1 to X, j=1 to Y, Y<X.

7. The solar tracking system of claim 6, wherein a ratio X:Y is at least 50:1.

8. The solar tracking system of claim 6, wherein each $SPC_i$ is wirelessly coupled to a corresponding $NCU_j$.

9. The solar tracking system of claim 8, wherein the $NCU_j$ are coupled to a central controller.

10. The solar tracking system of claim 9, wherein the central controller adjusts the performance model using machine learning algorithms based on energy sensed on the solar tracking system.

11. The solar tracking system of claim 10, wherein the performance model is adjusted periodically.

12. The solar tracking system of claim 6, wherein the NCU are configured to exchange data and commands between each other and are coupled to form a mesh network.

13. The solar tracking system of claim 5, wherein each $SPC_i$ is configured to operate at a default operation when losing communication with a corresponding network control unit ($NCU_j$).

14. The solar tracking system of claim 13, wherein the default operation includes orientating an $SPM_i$ to a default angle to zenith.

15. The solar tracking system of claim 1, wherein the performance model includes a diffuse table.

16. The solar tracking system of claim 1, wherein the weather conditions are determined from current weather conditions, forecasted weather conditions, or both.

17. The solar tracking system of claim 1, wherein an orientation of each of the multiple rows of solar panel modules ($SPM_i$) is an incident angle $\theta i$ between a normal to $SPM_i$ and a line from $SPM_i$ to the solar source, for i=1 to X.

18. A solar tracking system comprising:
    multiple rows of solar panel modules forming a grid of solar panel modules, wherein the multiple rows of solar panel modules are orientable to a solar source independently of each other; and
    a control system configured to orient each of the multiple rows of solar panel modules to the solar source independently of each other based on a performance model to optimize an energy output from the grid of solar panel modules, wherein the performance model predicts an energy output from the grid of solar panel modules based on an orientation of each of the multiple rows of solar panel modules to the solar source and first data including weather conditions local to each of the multiple rows of solar panel modules,
    wherein the performance model includes a polynomial having variables weighted by gains, and
    wherein the gains include regular tracking gains and backtracking gains depending on a time of day.

19. A solar tracking system comprising:
    multiple rows of solar panel modules ($SPM_i$) orientable to a solar source independently of each other; and
    a control system configured to orient each of the $SPM_i$ to the solar source independently of each other based on a performance model to optimize an energy output from the $SPM_i$, wherein the performance model predicts an energy output from the $SPM_i$ based on an orientation of each of the $SPM_i$ to the solar source and first data including weather conditions local to each of the $SPM_i$,
    wherein each of the $SPM_i$ includes a corresponding self-powered controller ($SPC_i$), for i=1 to X,
    wherein the control system includes network control units ($NCU_j$) each coupled to a corresponding one or more of the $SPC_i$, for i=1 to X, j=1 to Y, Y<X,
    wherein the $NCU_j$ are coupled to a central controller, and wherein the central controller includes:
  a weather look-up module for receiving weather data local to each of the $SPM_i$;
  a global-horizontal irradiance and diffuse horizontal irradiance module;
  a row-to-row tracking module for determining a slope of each of the $SPM_i$ to a horizontal;
  a diffuse-angle adjustor for adjusting the performance model based on the slopes, a time of year, and a time of day;
  a first communication module for transmitting orientation commands to each of the $SPC_i$ based on the performance model; and
  a second communication module for receiving data from each of the $NCU_j$ for i=1 to X, j=1 to Y.

* * * * *